United States Patent
Yagisawa et al.

(10) Patent No.: US 9,025,914 B2
(45) Date of Patent: May 5, 2015

(54) OPTICAL MODULE

(71) Applicant: Fujitsu Limited, Kawasaki-shi, Kanagawa (JP)

(72) Inventors: Takatoshi Yagisawa, Kawasaki (JP); Takashi Shiraishi, Isehara (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 14/190,379

(22) Filed: Feb. 26, 2014

(65) Prior Publication Data

US 2014/0178079 A1 Jun. 26, 2014

Related U.S. Application Data

(63) Continuation of application No. PCT/JP2011/072485, filed on Sep. 29, 2011.

(51) Int. Cl.
| | |
|---|---|
| *G02B 6/12* | (2006.01) |
| *H04B 10/80* | (2013.01) |
| *G02B 6/42* | (2006.01) |

(Continued)

(52) U.S. Cl.
CPC ............ *H04B 10/801* (2013.01); *G02B 6/4246* (2013.01); *G02B 6/4284* (2013.01); *G02B 6/4214* (2013.01); *G02B 6/43* (2013.01); *H04B 10/40* (2013.01)

(58) Field of Classification Search
CPC ........................... H02B 10/10; H04B 10/2503
USPC ..................................... 385/14; 398/139, 136
See application file for complete search history.

(56) References Cited

U.S. PATENT DOCUMENTS

| 6,661,939 B2 | 12/2003 | Kaneko et al. |
| 6,937,824 B2 * | 8/2005 | Watanabe ............... 398/135 |

(Continued)

FOREIGN PATENT DOCUMENTS

| JP | 9-116253 | 5/1997 |
| JP | 2004-258065 | 9/2004 |

(Continued)

OTHER PUBLICATIONS

Shiraishi, Takashi et al., Cost-effective On-board Optical Interconnection using Waveguide Sheet with Flexible Printed Circuit Optical Engine, Optical Society of America. OSA/OFC/NFOEC 2011.

(Continued)

*Primary Examiner* — Ellen Kim
(74) *Attorney, Agent, or Firm* — Fujitsu Patent Center

(57) ABSTRACT

An optical module includes: a first circuit board that has a first edge connector and a connector socket; and an optical transceiver module that is electrically connected to the first circuit board via the connector socket. The optical transceiver module includes a second circuit board on which an E/O converter, a drive circuit that drives the E/O converter, an O/E converter, and a current-to-voltage conversion circuit that converts an output current of the O/E converter into a voltage signal are mounted. The second circuit board has a second edge connector corresponding to the connector socket mounted on the first circuit board. Signal lines of the drive circuit are pulled out from the drive circuit in a first direction. Signal lines of the current-to-voltage conversion circuit are pulled out from the current-to-voltage conversion circuit in a second direction that is substantially opposite to the first direction.

11 Claims, 7 Drawing Sheets

(51) Int. Cl.
*H04B 10/40* (2013.01)
*G02B 6/43* (2006.01)

(56) References Cited

U.S. PATENT DOCUMENTS

| | | | |
|---|---|---|---|
| 2006/0062512 | A1 | 3/2006 | Lee et al. |
| 2010/0054671 | A1 | 3/2010 | Ban et al. |
| 2012/0275784 | A1* | 11/2012 | Soto et al. .................. 398/38 |
| 2014/0049292 | A1* | 2/2014 | Popescu et al. .............. 327/100 |

FOREIGN PATENT DOCUMENTS

| JP | 2006-113566 | 4/2006 |
|---|---|---|
| JP | 2009-3253 | 1/2009 |

OTHER PUBLICATIONS

International Search Report, mailed in connection with PCT/JP2011/072485 and mailed Nov. 1, 2011.

Notification of Transmittal of Translation of The International Preliminary Report on Patentability (Form PCT/IB/338, Form PCT/IB/373 & Form PCT/ISA/237), PCT/JP2011/072485, 5 pages, dated Apr. 10, 2014.

* cited by examiner

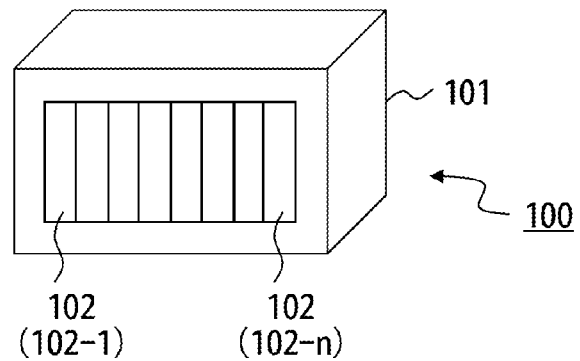
F I G. 1A
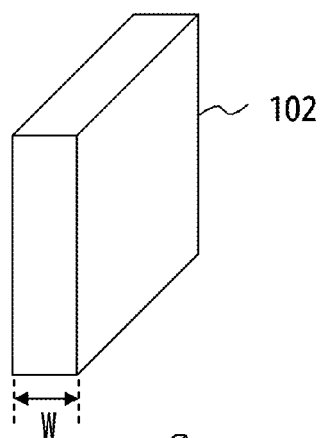
F I G. 1B
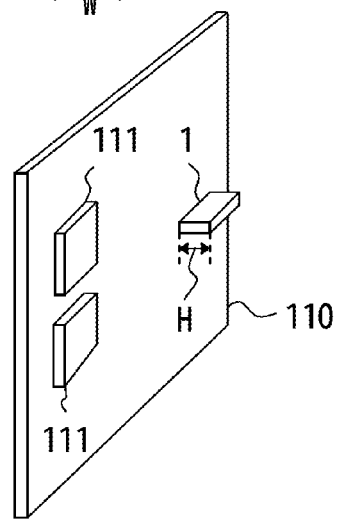
F I G. 1C

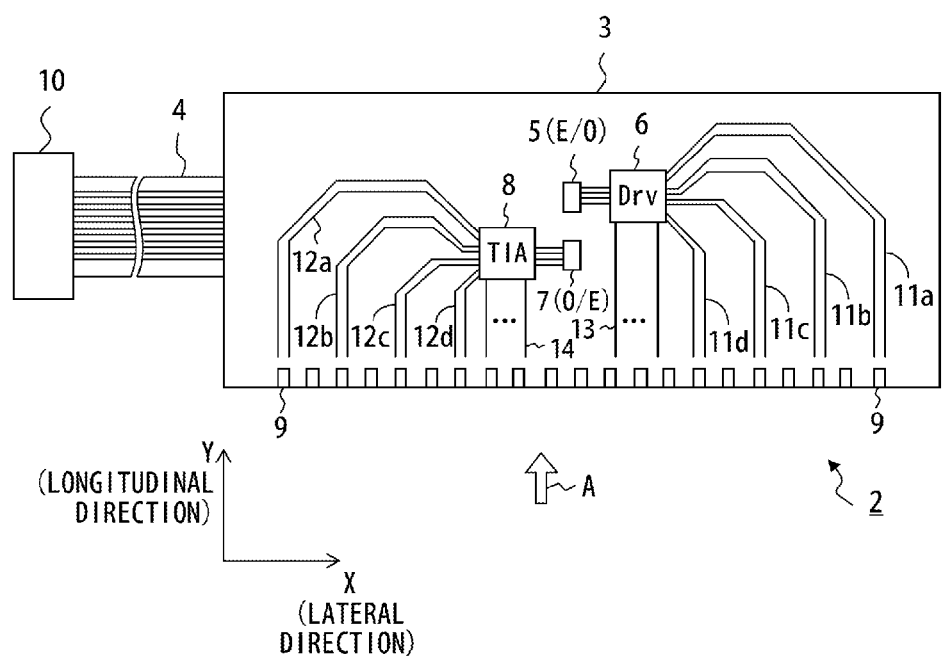
F I G. 2

F I G. 7A
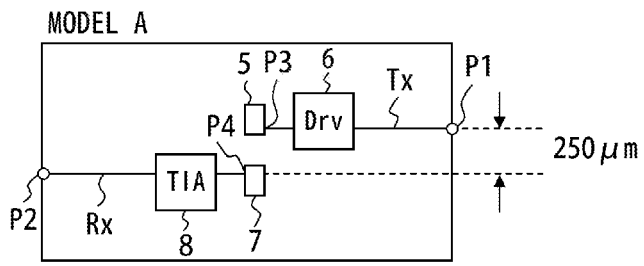
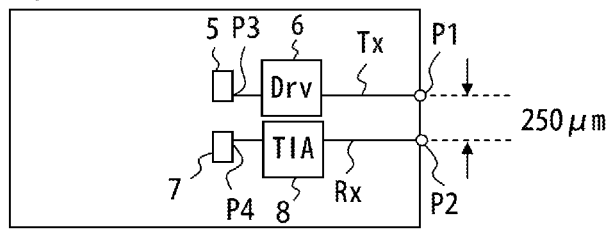
F I G. 7B
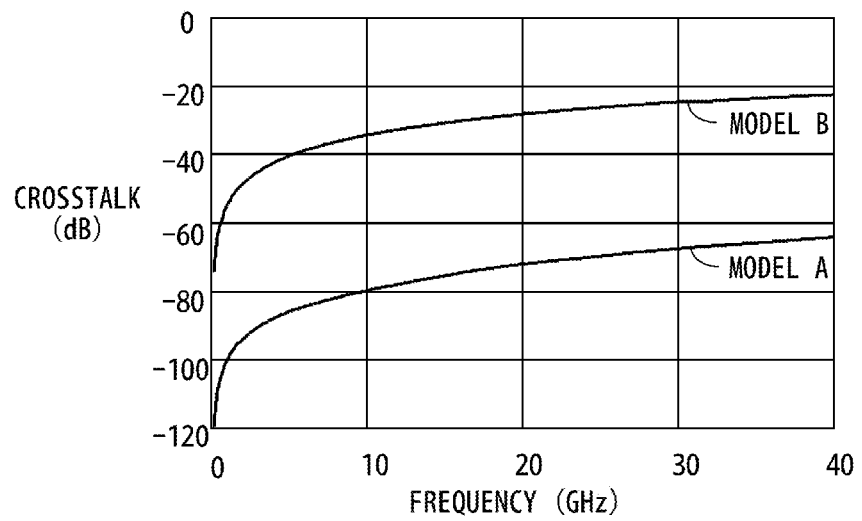

OPTICAL MODULE

CROSS-REFERENCE TO RELATED APPLICATION

This application is a continuation application of International Application PCT/JP2011/072485 filed on Sep. 29, 2011 and designated the U.S., the entire contents of which are incorporated herein by reference.

FIELD

The embodiments discussed herein are related to an optical module for transmitting and receiving an optical signal.

BACKGROUND

In recent years, a system for processing information using a plurality of processors which operate in parallel has been popular. For example, a blade server is an information processing system which includes a plurality of blades. Each of the blades includes a CPU and a memory, and operates as a computer. The plurality of blades are accommodated in a chassis in the specified shape.

Each of the blades can transmit and receive data to/from other blades. Namely, the blades are connected through a transmission link. According to one embodiment, the blades are connected through a metal cable transmitting an electrical signal, such as a coaxial cable. In this case, a signal conforming to, e.g., a PCI (Peripheral Components Interconnect) is transmitted between the blades.

However, further increases in speed of information processing have been requested, and further increases in speed of a signal transmitted between blades have also been needed. For example, the transmission between blades of a high-speed signal with a speed exceeding 10 Gb/s is sometimes requested. For that reason, a configuration in which blades are connected through an optical interface, instead of the electric interface as described above, has been developed.

When an optical interconnection in which blades are connected through an optical interface is realized, each of the blades includes an optical module for transmitting and receiving an optical signal. The optical module includes an optical transmitter and an optical receiver. In a blade server which includes a large number of blades, for example, each of the blades may include a large number of optical transmitters and optical receivers in order to transmit and receive data to/from a large number of other blades. In this case, in each of the optical modules, the large number of optical transmitters and optical receivers are preferably implemented with a high density.

As a related art, an optical waveguide board described below has been proposed. This optical waveguide board includes a base material, a film, an optical element, and an optical path switch. The film, in which an optical waveguide is formed that includes a core that is an optical path propagating an optical signal and a clad surrounding the core, is provided on a principal surface of the base material. The optical element is implemented on at least either of the base material and the film, and is optically coupled to the optical waveguide. The optical path switch changes the optical path propagating an optical signal in a desired direction. (For example, Japanese Laid-open Patent Publication No. 2004-258065)

As another related art, an optical module which includes an optical element which is flip-chip implemented on a board, an optical waveguide which is formed on the board and optically coupled to the optical element, and an underfill resin which is filled in between the board and the optical element and covers an optical connecting point between the optical element and the optical waveguide, has been proposed. (For example, U.S. Pat. No. 6,661,939)

As still another related art, an optical module which includes a flexible printed circuit on which optical elements (E/O and O/E) are flip-chip mounted, and an optical waveguide which is provided on the flexible printed circuit, has been proposed. A 45-degree mirror is formed in the optical waveguide so as to be optically coupled to a light emitting surface of the E/O and a photo detector surface of the O/E. (For example, Cost-effective On-board Optical Interconnection using Waveguide Sheet with Flexible Printed Circuit Optical Engine, Takashi Shiraishi, et al., OFC/NFOEC 2011, OTuQ5)

In the known arts, it is not easy to implement optical transmitters and optical receivers in an optical module with a high density. For that reason, when the numbers of optical transmitters and optical receivers implemented in an optical module increase, the size of the optical module increases. In other words, when the size of the optical module is determined according to a standard, etc., it is difficult to increase the numbers of optical transmitters and optical receivers implemented in the optical module.

Further, the optical module includes optical devices and electric devices. When an electric circuit is a differential circuit, a specified fan-out is required. Additionally, when transmission signal lines (signal lines for propagating signals to E/O converters) and received signal lines (signal lines for propagating output signals from O/E converters) are not appropriately designed on a board of the optical module, the size of the board increases. Here, if the pitch or spacing of these signal lines are made smaller in order to reduce the size of the board, a crosstalk between channels and a crosstalk between a transmission signal and a received signal increase. Accordingly, it is required to widen the pitch or spacing of the signal lines in order to suppress the crosstalks, and therefore the board of the optical module becomes larger.

When the optical module as described above is provided on a blade of a blade server, it is preferable that an area occupied by the optical module in the blade is small. In order to reduce the area for mounting the optical module, an optical module board on which one or more optical modules are mounted may be vertically attached to a mother board of the blade.

However, as described above, it is difficult to reduce the size of the optical module itself. For that reason, if the optical module board on which one or more optical modules are mounted is vertically attached to the mother board of the blade, the width of the blade increases. Accordingly, in the configuration where the optical module board on which one or more optical modules are mounted is vertically attached to the mother board of the blade, it is requested to increase in mounting density of the optical modules and reduce the size (in particular, reduce the height) of the optical module.

SUMMARY

According to an aspect of the embodiments, an optical module includes: a first circuit board in which a first edge connector is formed and a connector socket is mounted substantially in parallel to the first edge connector; and an optical transceiver module that is electrically connected to the first circuit board via the connector socket. The optical transceiver module includes: a second circuit board on which an electrical-to-optical converter, a drive circuit that drives the electrical-to-optical converter, an optical-to-electrical converter, and a current-to-voltage conversion circuit that converts an output current of the optical-to-electrical converter into a voltage signal are mounted; and an optical waveguide that guides an optical signal generated by the electrical-to-optical converter to an output end of the optical transceiver module, and that guides an optical signal input to the optical transceiver module to the optical-to-electrical converter. The second circuit board has a second edge connector corresponding to the connector socket mounted on the first circuit board. The electrical-to-optical converter, the drive circuit, the optical-to-electrical converter, and the current-to-voltage conversion circuit are disposed in the center area of the second circuit board. Signal lines of the drive circuit are pulled out from the drive circuit in a first direction, and are formed to reach corresponding terminals of the second edge connector. Signal lines of the current-to-voltage conversion circuit are pulled out from the current-to-voltage conversion circuit in a second direction that is substantially opposite to the first direction, and are formed so as to reach corresponding terminals of the second edge connector.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIGS. 1A, 1B, and 1C illustrate a blade server that uses an optical module according to an embodiment.

FIG. 2 is a plan view of an optical transceiver module included in an optical module.

FIGS. 7A and 7B illustrate a simulation result regarding a crosstalk between a transmission signal and a received signal.

DESCRIPTION OF EMBODIMENTS

Figure 3:
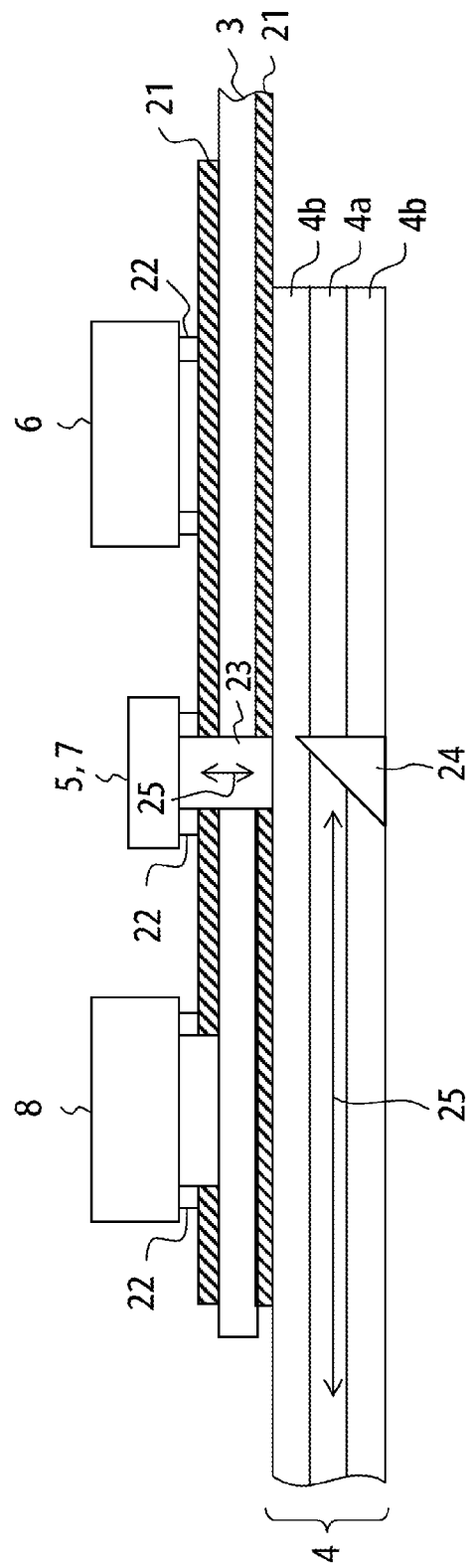
FIG. 3 is a side view of the optical transceiver module illustrated in FIG. 2.

An optical module according to an embodiment will be described below with reference to the drawings. In the following, the optical module according to the embodiment is used, but is not particularly limited to be used, in a blade server. Namely, the optical module according to the embodiment is mounted on a blade of a blade server in the example below.

FIG. 1 illustrates a blade server 100 that uses the optical module according to the embodiment. As illustrated in FIG. 1A, the blade server 100 includes a chassis 101 and a plurality of blades 102 (102-1 to 102-n). Each of the blades 102 has, for example, an approximately rectangular parallelepiped shape, as illustrated in FIG. 1B. Note that the blade 102 illustrated in FIG. 1B corresponds to one of the plurality of blades inserted into the chassis 101 of the blade server 100 illustrated in FIG. 1A.

The blade server 100 includes optical links for transmitting optical signals between the blades 102. The optical link is realized by, for example, an optical waveguide and an optical fiber. On the optical link, an optical switch and/or an optical cross connect may be provided. Each of the blades 102 can transmit and receive data to/from one or more other blades 102 using the optical links.

Each of the blades 102 includes a blade main board 110 as illustrated in FIG. 1C. On the blade main board 110, one or more CPUs 111 are mounted. A memory IC is also mounted on the blade main board 110, which is not particularly illustrated. The memory may be provided in the CPU 111. Each of the blades 102 can operate as a computer.

Each of the blades 102 includes an optical module. The optical module 1 is attached to the blade main board 110 as illustrated in FIG. 1C. In this example, on the blade main board 110, a vertical connection type edge connector socket not illustrated is implemented. The optical module 1 is attached to the blade main board 110 using the vertical connection type edge connector socket. Therefore, the optical module 1 is attached to the blade main board 110 so as to project in the direction vertical to one surface of the blade main board 110.

The optical module 1 includes an optical transmitter and an optical receiver. An electric circuit of the optical transmitter and the optical receiver is electrically connected to a circuit formed in the blade main board 110. The optical module 1 can convert an electrical signal generated in the blade main board 110 into an optical signal and transmit the optical signal to another blade. Further, the optical module 1 can convert an optical signal received from another blade into an electrical signal and guide the electrical signal to the blade main board 110.

In order to make the blade server 100 efficiently operate, it is preferable that each of the blades 102 can transmit and receive data to/from a plurality of other blades. In this case, each of the optical modules 1 includes a plurality of optical transmitters and a plurality of optical receivers.

In the example illustrated in FIG. 1, the blade server 100 is realized by the plurality of blades 102 accommodated in a chassis 101. In this case, an optical module 1 provided in a blade transmits and receives an optical signal to/from another blade accommodated in the chassis 101. However, the blade server 100 may be realized by a plurality of blades accommodated in a plurality of chassis. In this case, an optical module 1 provided in a blade may transmit and receive an optical signal to/from another blade accommodated in the same chassis, and may transmit and receive an optical signal to/from a blade accommodated in another chassis. In addition, an optical module 1 provided in a blade may transmit and receive an optical signal to/from another optical module in the same blade.

In the blade server 100 illustrated in FIGS. 1A-1C, when more blades 102 are accommodated in the chassis 101, the processing capability is improved. When the width W of the blade illustrated in FIG. 1B is reduced, more blades 102 can be accommodated in the chassis 101. Therefore, in this case, the height H of the optical module 1 illustrated in FIG. 1C is requested to be reduced. Further, as an example, when the width W of the blade 102 is determined according to a standard, etc., it is preferable to realize a high density of a circuit of the optical module 1 in order to implement more optical transmitters and optical receivers on the optical module 1.

FIG. 2 is a plane view of an optical transceiver module included in the optical module 1. The optical transceiver module 2 includes a flexible printed circuit 3 and an optical waveguide 4.

The Flexible Printed Circuit (FPC) 3 is a flexible thin printed board. The thickness of the flexible printed circuit 3 is, but is not particularly limited to, for example, 20 to 50 μm.

Further, a material of the flexible printed circuit 3 is, but is not particularly limited to, for example, polyimide resin.

On one surface of the flexible printed circuit 3, an electrical-to-optical (E/O) converter 5, a driver IC 6, an optical-to-electrical (O/E) converter 7, and a transimpedance amplifier (TIA) 8 are face-down mounted with, for example, a flip chip. In the face-down mount, devices are mounted so that the faces of the devices (e.g., a light emitting surface of the E/O converter, a photo detector surface of the O/E converter, or a surface in which an IC pad of a circuit element is formed) face downward (i.e., to the side of aboard). In this example, the E/O converter 5, the driver IC 6, the O/E converter 7, and the TIA 8 are disposed near the center of one surface of the flexible printed circuit 3.

The shape of the flexible printed circuit 3 is approximately rectangular. Hereinafter, an X direction illustrated in FIG. 2 is referred to as a "lateral direction (or horizontal direction)", and a Y direction illustrated in FIG. 2 is referred to as a "longitudinal direction (or vertical direction)". In this example, the "lateral direction (or horizontal direction)" corresponds to a direction in parallel to a longer side of the rectangular flexible printed circuit 3. The "longitudinal direction (or vertical direction)" corresponds to a direction in parallel to a shorter side of the rectangular flexible printed circuit 3.

The E/O converter 5 is driven by the driver IC 6 and generates an optical signal corresponding to a data signal. Namely, the E/O converter 5 converts an input electrical signal into an optical signal. The E/O converter 5 is realized by, for example, a laser diode. The laser diode is, but is not particularly limited to, for example, a Vertical-Cavity Surface-Emitting Laser (VCSEL). The E/O converter 5 may be configured to convert a plurality of electrical signals into respective optical signals. In this case, the E/O converter 5 includes a plurality of laser diodes.

The driver IC 6 is a drive circuit which drives the E/O converter 5 in accordance with a data signal. Namely, the driver IC 6 drives the E/O converter 5 with the current corresponding to the data signal. As a result, the E/O converter 5 generates an optical signal corresponding to the data signal. The data signal is generated in the blade main board 110 illustrated in FIG. 1C, and is guided to the drive IC 6 via a corresponding terminal of an edge connector 9 and a circuit formed in the flexible printed circuit 3.

The O/E converter 7 converts an optical signal received via the optical waveguide 4 into an electrical signal. This electrical signal is a current signal that represents the received optical signal. The electrical signal generated by the O/E converter 7 is guided to the TIA 8. The O/E converter 7 is realized by, for example, a photo diode. The O/E converter 7 may be configured to convert a plurality of optical signals into respective electrical signals. In this case, the O/E converter 7 includes a plurality of photo diodes.

The TIA 8 converts a current signal generated by the O/E converter 7 into a voltage signal. Namely, the TIA 8 operates as a current-to-voltage conversion circuit. At this time, the TIA 8 may output a differential voltage signal. The output signal of the TIA 8 is guided to the blade main board 110 illustrated in FIG. 1C via a circuit formed in the flexible printed circuit 3 and a corresponding terminal of the edge connector 9. The optical transceiver module 2 may use another current-to-voltage conversion circuit instead of the TIA 8.

The edge connector 9 is formed in an edge area on one side of the flexible printed circuit 3. In an example illustrated in FIG. 2, the edge connector 9 is formed in an edge area on a lower side of the flexible printed circuit 3. The terminals of the edge connector 9 are electrically connected to corresponding terminals of a connector socket, which is provided on an optical module circuit board, as will be described later.

A circuit is formed on the surfaces (an upper surface and a lower surface) of the flexible printed circuit 3. The upper surface refers to a surface on which the E/O converter 5, the O/E converter 7, etc., are mounted, of two surfaces of the flexible printed circuit 3. The lower surface refers to the other surface of the two surfaces of the flexible printed circuit 3.

This circuit is realized by a conductor printed on the flexible printed circuit 3. The printed conductor is, for example, copper. Further, this circuit may include a circuit component such as a resistor, a capacitor, and/or a coil in addition to the printed conductor.

On the upper surface of the flexible printed circuit 3, signal lines which transmit a data signal is formed between the driver IC 6 and the edge connector 9. In this example, the E/O converter 5 includes four laser diodes, and it can generate four independent optical signals. Accordingly, in the flexible printed circuit 3, Tx signal lines 11a-11d are formed. The Tx signal lines 11a-11d transmit respective Tx data signals. The Tx data signals are guided from corresponding terminals of the edge connector 9 through the Tx signal lines 11a-11d to the driver IC 6. Then, the Tx data signals are used by the driver IC 6 as drive signals which drive the E/O converter 5. In FIG. 2, each of the Tx signal lines 11a-11d is, for simplicity, not connected to the edge connector 9; however, each of the Tx signal lines 11a-11d is formed so as to be electrically connected to the corresponding terminal of the edge connector 9.

On the upper surface of the flexible printed circuit 3, signal lines which transmit a data signal is also formed between the TIA 8 and the edge connector 9. In this example, the O/E converter 7 includes four photodiodes, and it can convert four input optical signals into respective electrical signals (i.e., Rx data signals). Accordingly, Rx signal lines 12a-12d are formed in the flexible printed circuit 3. The Rx signal lines 12a-12d transmit respective Rx data signals. The Rx data signals are guided from the TIA 8 through the Rx signal lines 12a-12d to corresponding terminals of the edge connector 9. In FIG. 2, each of the Rx signal lines 12a-12d is, for simplicity, not connected to the edge connector 9; however, each of the Rx signal lines 12a-12d is formed so as to be electrically connected to the corresponding terminal of the edge connector 9.

In this example, the Tx data signal is a differential signal. Therefore, each of the Tx signal lines 11a-11d is realized by a pair of conductor wires as illustrated in FIG. 2. Similarly, in this example, the Rx data signal is a differential signal. Therefore, each of the Rx signal lines 12a-12d is also realized by a pair of conductor wires as illustrated in FIG. 2.

The E/O converter 5 and the O/E converter 7 are aligned in a longitudinal direction near the center of the upper surface of the flexible printed circuit 3. The driver IC 6 is disposed to the right of the E/O converter 5. The E/O converter 5 and the driver IC 6 are preferably close to each other. Further, a signal line which supplies a drive current from the driver IC 6 to each of the laser diodes is formed between the E/O converter 5 and the driver IC 6.

The TIA 8 is disposed to the left of the O/E converter 7. The O/E converter 7 and the TIA 8 are preferably close to each other. Further, a signal line which guides a current signal generated by each of the photodiodes of the O/E converter 7 to the TIA 8 is formed between the O/E converter 7 and the TIA 8.

The Tx signal lines 11a-11d are pulled out from the driver IC 6 in a rightward direction, and they are formed so as to reach corresponding terminals of the edge connector 9. The terminals of the edge connector 9 corresponding to the Tx signal lines 11a-11d are formed in a lower right area of the flexible printed circuit 3. Here, the Tx signal lines 11a-11d propagate respective electrical signals independent of each other (i.e., Tx data signal). Namely, when the Tx signal lines 11a-11d are close to each other, interferences may occur between the Tx data signals. Therefore, the Tx signal lines 11a-11d are preferably formed so as to not be close to each other. Accordingly, the Tx signal lines 11a-11d are formed so as to be a fan shape in an area near the driver IC 6, in order to expand respective spaces between the Tx signal lines 11a-11d.

The Rx signal lines 12a-12d are pulled out from the TIA 8 in a leftward direction, and they are formed so as to reach corresponding terminals of the edge connector 9. The terminals of the edge connector 9 corresponding to the Rx signal lines 12a-12d are formed in a lower left area of the flexible printed circuit 3. Here, the Rx signal lines 12a-12d propagate respective electrical signals independent of each other (i.e., Rx data signal). Namely, when the Rx signal lines 12a-12d are close to each other, interferences may occur between the Rx data signals. Therefore, it is preferable that the Rx signal lines 12a-12d also be formed so as not to be close to each other. Accordingly, the Rx signal lines 12a-12d are formed so as to be a fan shape in an area near the TIA 8, in order to expand respective spaces between the Rx signal lines 12a-12d.

A pitch or spacing of terminals of a connector for electrical signals is larger than that of an optical element or an optical waveguide. Also for that reason, the Tx signal lines 11a-11d which are pulled out from the driver IC 6 are formed so as to be a fan shape. Similarly, the Rx signal lines 12a-12d which are pulled out from the TIA 8 are also formed so as to be a fan shape.

As described above, the Tx signal lines 11a-11d are pulled out from the driver IC 6 in a rightward direction. On the other hand, the Rx signal lines 12a-12d are pulled out from the TIA 8 in a leftward direction. Namely, both a direction in which the Tx signal lines 11a-11d are pulled out from the driver IC 6 and a direction in which the Rx signal lines 12a-12d are pulled out from the TIA 8 are substantially lateral directions. However, the direction in which the Tx signal lines 11a-11d are pulled out from the driver IC 6 is substantially opposite to the direction in which the Rx signal lines 12a-12d are pulled out from the TIA 8.

Further, the Tx data signals are guided from the Tx signal lines 11a-11d through the driver IC 6 to the E/O converter 5. Namely, the Tx data signals are guided in a leftward direction in FIG. 2. On the other hand, the Rx data signals are guided from the O/E converter 7 through the TIA 8 to the Rx signal lines 12a-12d. Namely, the Rx data signals are also guided in a leftward direction in FIG. 2. As described above, the Tx data signals and the Rx data signals are guided in substantially the same direction in an area in which the E/O converter 5, the driver IC 6, the O/E converter 7, and the TIA 8 are mounted.

A plurality of control lines 13 electrically connect the driver IC 6 to corresponding terminals of the edge connector 9. In FIG. 2, the control lines 13 are not connected to the edge connectors 9 for simplicity. The control lines 13 transmit respective driver control signals. The driver control signal may include a signal to control the driver IC 6 in order for the E/O converter 5 to operate in a preferable condition, for example. The driver control signal may also include a signal to stop the driver IC 6 when there are no Tx data signals.

A plurality of control lines 14 electrically connect the TIA 8 to corresponding terminals of the edge connector 9. In FIG. 2, the control lines 14 are, for simplicity, not connected to the edge connectors 9. The control lines 14 transmit respective TIA control signals. The TIA control signal may include a signal to stop the TIA 8 when no optical signals are input, for example.

The flexible printed circuit 3 is a dual-layer board which can form a printed circuit on the surfaces (an upper surface and a lower surface) in this example. The Tx signal lines 11a-11d, the Rx signal lines 12a-12d, and the control lines 13 and 14 are formed on the upper surface of the flexible printed circuit 3. Here, the control lines 13 and 14 are formed in an area between the Tx signal lines 11a-11d and the Rx signal lines 12a-12d. Further, on the upper surface of the flexible printed circuit 3, power supply lines may be formed to supply power to the E/O converter 5, the driver IC 6, the O/E converter 7, the TIA 8, etc. Furthermore, on the lower surface of the flexible printed circuit 3, a conductor may be formed that realizes a ground.

In this example, the optical waveguide 4 is realized by a film in which a core propagating a light and a clad surrounding the core are formed. The thickness of the core is, but is not particularly limited to, for example, 40 to 60 µm. In addition, this film is realized by, but is not particularly limited to, for example, a polymer material.

The optical waveguide 4 includes a plurality of optical waveguide channels. Each of the optical waveguide channels transmits an optical signal. Further, the plurality of optical waveguide channels are formed at specified spacing. As an example, the optical waveguide channels are formed at 0.25 mm spacing, but are not particularly limited to this. The number of optical waveguide channels formed in the optical waveguide 4 is, but is not particularly limited to, 12, in this example. Further, in this example, the optical waveguide 4 includes four transmitting optical waveguide channels and four receiving optical waveguide channels. Each of the transmitting optical waveguide channels guides an optical signal generated by the E/O converter 5 to an end of the optical transceiver module 2. In addition, each of the receiving optical waveguide channels guides an optical signal input to the optical transceiver module 2 to the O/E converter 7. The other four optical waveguide channels are not used.

The E/O converter 5 optically coupled to the optical waveguide 4 includes four laser diodes. The four laser diodes are aligned at the same spacing as those of the optical waveguide channels. Namely, the four laser diodes are aligner at 0.25 spacing. In addition, the O/E converter 7 optically coupled to the optical waveguide 4 includes four photodiodes. The four photodiodes are aligner at the same spacing as those of the optical waveguide channels. Namely, the four photodiodes are also aligner at 0.25 spacing.

The optical waveguide 4 is stuck on the lower surface of the flexible printed circuit 3. As will be explained later with reference to FIG. 3, the optical waveguide 4 reaches at least the position where the E/O converter 5 and the O/E converter 7 are mounted from the left end of the flexible printed circuit 3. Namely, the optical waveguide 4 is fixed to the flexible printed circuit 3 so as to propagate an optical signal in the lateral direction of the flexible printed circuit 3.

An optical connector 10 is optically coupled to an end of the optical waveguide 4. The optical connector 10 is, for example, a PMT connector. The PMT connector is a multi-core optical connector for a polymer optical waveguide.

FIG. 3 is a side view of the optical transceiver module 2 illustrated in FIG. 2. Here, FIG. 3 illustrates the optical transceiver module 2 obtained from a visual line direction represented by the arrow A in FIG. 2. Note that FIG. 3 illustrates a portion of the optical transceiver module 2. In addition, FIG.

3 schematically illustrates the flexible printed circuit 3 and the optical waveguide 4 in order to explain a structure of the optical transceiver module 2.

On an upper surface and a lower surface of the flexible printed circuit 3, a conductor 21 is selectively formed. A circuit realized by the conductor 21 includes the Tx signal lines 11a-11d, the Rx signal lines 12a-12d, and the control lines 13 and 14. Further, the circuit realized by the conductor 21 includes power supply lines for supplying power to the E/O converter 5, the driver IC 6, the O/E converter 7, and the TIA 8. The conductor 21 formed on the lower surface of the flexible printed circuit 3 may provide a ground.

On the upper surface of the flexible printed circuit 3, the E/O converter 5, the driver IC 6, the O/E converter 7, and the TIA 8 are mounted. In this example, the E/O converter 5, the driver IC 6, the O/E converter 7, and the TIA 8 are face-down connected to the conductor 21. As an example, the E/O converter 5, the driver IC 6, the O/E converter 7, and the TIA 8 are flip-chip mounted on the upper surface of the flexible printed circuit 3. In this case, the E/O converter 5, the driver IC 6, the O/E converter 7, and the TIA 8 are electrically connected to the conductor 21 using bump 22.

The light emitting surface of the E/O converter 5 and the photo detector surface of the O/E converter 7 are faced to the flexible printed circuit 3. The flexible printed circuit 3 has a through-hole 23 in a region on which the E/O converter 5 and the O/E converter 7 are mounted. When the flexible printed circuit 3 is transparent to an optical wavelength of an optical signal, the through-hole 13 does not need to be formed in the flexible printed circuit 3.

The optical waveguide 4 includes a core 4a propagating light and a clad 4b surrounding the core 4a. The refractive indexes of the core 4a and the clad 4b are different from each other. The optical waveguide 4 is attached to the lower surface of the flexible printed circuit 3. In this example, the optical waveguide 4 is stuck to the lower surface of the flexible printed circuit 3 with an adhesive.

A lens may be provided between the flexible printed circuit 3 and the optical waveguide 4 in order to improve the optical coupling efficiency between the optical waveguide 4 and optical devices (the E/O converter 5 and the O/E converter 7). In this case, a sheet-like lens with a thickness of about 100 μm may be used.

The optical waveguide 4 includes a mirror 24 reflecting an optical signal. The mirror 14 is formed so as to have an angle of 45 degrees to the propagation direction of light in the optical waveguide 4. Further, the mirror 24 is disposed so as to be positioned just below the E/O converter 5 and the O/E converter 7. Namely, the optical waveguide 4 is coupled to the lower surface of the flexible printed circuit 3 so that the mirror 24 is positioned just below the E/O converter 5 and the O/E converter 7.

An arrow 25 illustrated in FIG. 3 indicates an optical signal. Namely, an optical signal generated by the E/O converter 5 is reflected by the mirror 24, and is propagated to the optical connector 10 via the core 4a. In addition, an input optical signal is propagated via the core 4a, and is guided to the O/E converter 7 by the mirror 24.

Figure 4:
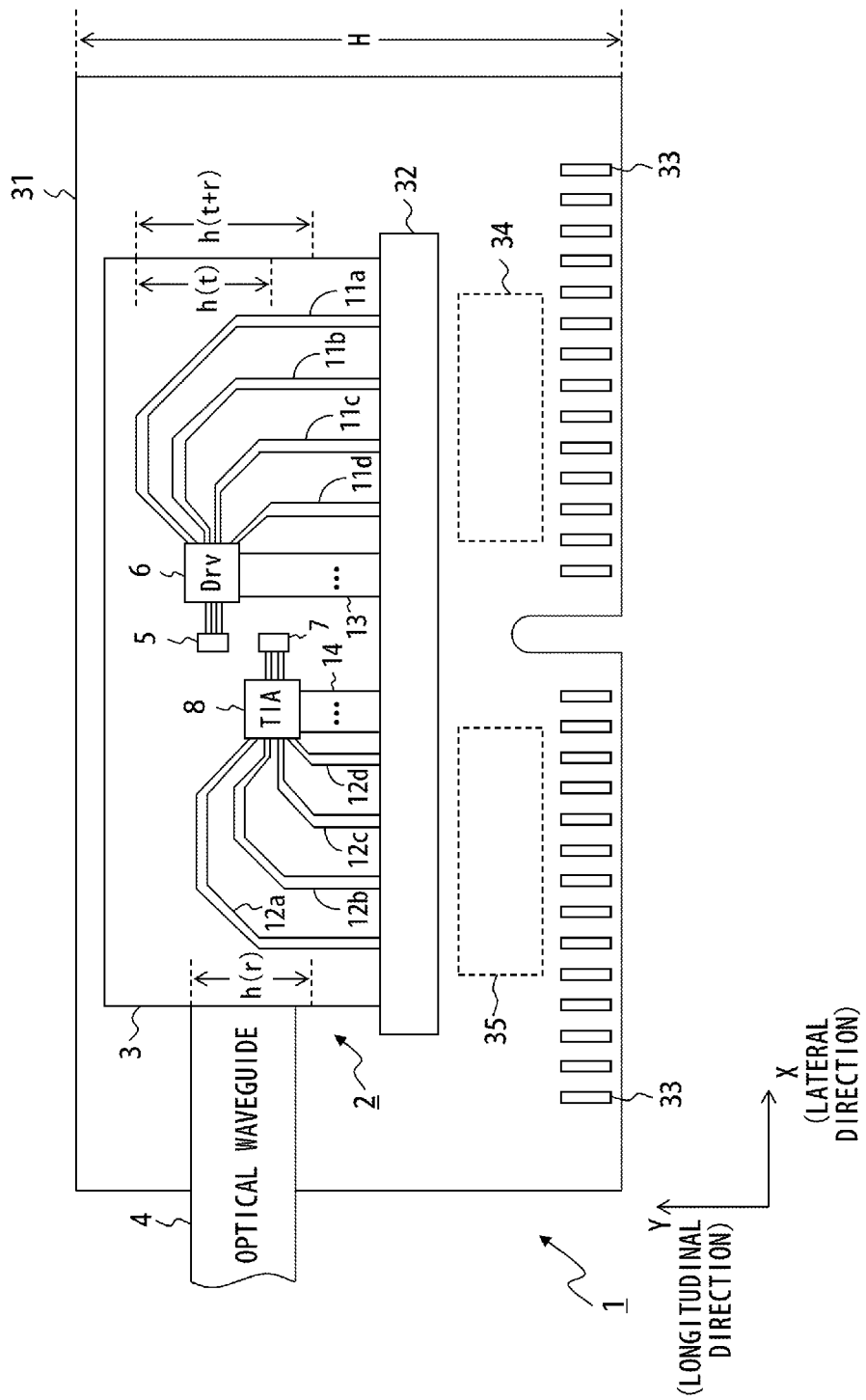
FIG. 4 illustrates a configuration of an optical module according to an embodiment.

FIG. 4 illustrates a configuration of the optical module 1 according to the embodiment. The optical module 1 includes an optical module circuit board 31 and the optical transceiver module 2 as explained with reference to FIG. 2 and FIG. 3. An X direction illustrated in FIG. 4 is hereinafter referred to as a "lateral direction (or horizontal direction)". A Y direction illustrated in FIG. 4 is referred to as a "longitudinal direction (or vertical direction)". In this example, the "lateral direction (or horizontal direction)" corresponds to a direction in parallel to a longer side of the rectangular optical module circuit board 31. The "longitudinal direction (or vertical direction)" corresponds to a direction in parallel to a shorter side of the rectangular optical module circuit board 31.

On the optical module circuit board 31, a connector socket 32 is mounted. In addition, edge connector 33 is formed along one side of the optical module circuit board 31. Further, a CPU which controls the driver IC 6 and the TIA 8 may be mounted on the optical module circuit board 31.

The optical module circuit board 31 has a circuit on the surface. In addition, the optical module circuit board 31 may be a multilayer board. In this case, the optical module circuit board 31 also has a circuit on an inner layer. The circuit formed in the optical module circuit board 31 is realized by a printed conductor. This circuit includes at least conductor lines which electrically connect the Tx signal lines 11a-11d and the Rx signal lines 12a-12d formed in the flexible printed circuit 3 to corresponding terminals of the edge connector 33. A material of the optical module circuit board 31 is, but is not particularly limited to, for example, resin, ceramic, or metal.

The connector socket 32 is disposed to expand in a lateral direction. Namely, the connector socket 32 is mounted on the optical module circuit board 31 approximately in parallel to the edge connector 33. Terminals of the connector socket 32 are electrically connected to the circuit formed in the optical module circuit board 31. The connector socket 32 accommodates the flexible printed circuit 3 of the optical transceiver module 2 illustrated in FIG. 2 and FIG. 3. At this time, the terminals of the edge connector 9, which is formed in the flexible printed circuit 3, are electrically connected to corresponding terminals of the connector socket 32. Accordingly, the optical transceiver module 2 is electrically connected to the circuit formed in the optical module circuit board 31 via the connector socket 32.

The edge connector 33 is formed so as to be electrically connected to corresponding terminals of the connector socket provided on the blade main board 110. The optical module circuit board 31 and the edge connectors 33 are not particularly limited.

In an area 34, signal lines that electrically connect the Tx signal lines 11a-11d formed in the flexible printed circuit 3 to the corresponding terminals of the edge connector 33 are formed. In an area 35, signal lines that electrically connect the Rx signal lines 12a-12d formed in the flexible printed circuit 3 to the corresponding terminals of the edge connector 33 are formed. In the areas 34 and 35, these signal lines may be formed on the surface of the optical module circuit board 31 or on an inner layer of the optical module circuit board 31.

As a result of the configuration above, in the optical module 1 according to the embodiment, the longitudinal length (i.e., height H) is reduced. With reference to a configuration of a comparative example, it will be explained below that the height H of the optical module 1 according to the embodiment is reduced.

Figure 5:
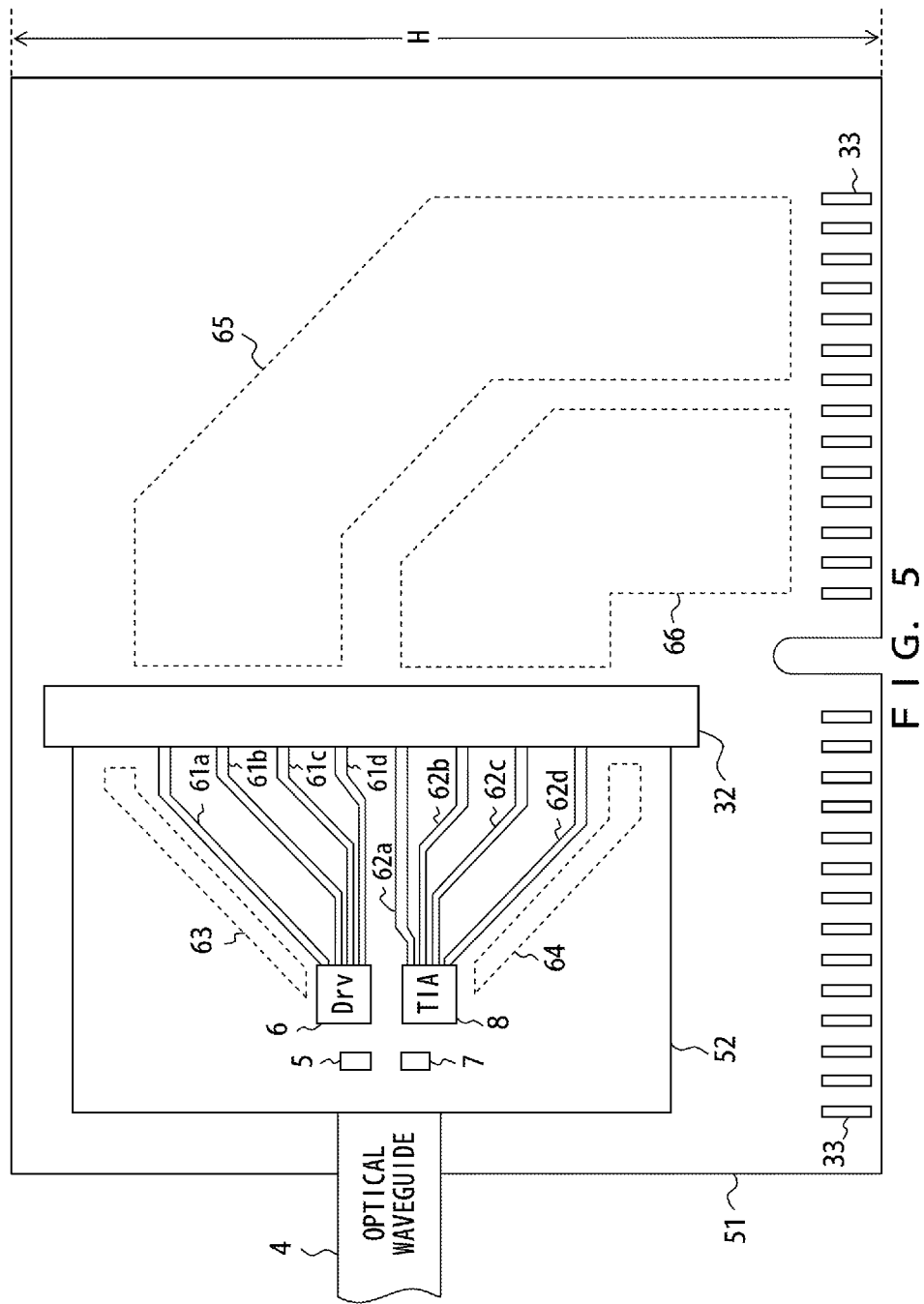
FIG. 5 illustrates a configuration of an optical module in a comparative example.

FIG. 5 illustrates a configuration of an optical module in a comparative example. The optical module illustrated in FIG. 5 includes an optical module circuit board 51, a flexible printed circuit 52, and an optical waveguide 4. On the optical module circuit board 51, a connector socket 32 is mounted. Along one side of the optical module circuit board 51, edge connector 33 is formed. Note that the connector socked 32 is disposed to expand in a longitudinal direction of the optical module circuit board 51. Namely, the connector socket 32 is mounted so as to be approximately orthogonal to the edge connectors 33.

On the flexible printed circuit 52, an E/O converter 5, a driver IC 6, an O/E converter 7, and a TIA 8 are mounted. The driver IC 6 and the TIA 8 are disposed on the same side with respective to the E/O converter 5 and the O/E converter 7. Namely, the driver IC 6 and the TIA 8 are disposed to the right of the E/O converter 5 and the O/E converter 7, respectively.

Tx signal lines 61a-61d are pulled out from the driver IC 6 in a rightward direction, and are formed so as to be electrically connected to corresponding terminals of the edge connector 33. Here, the Tx signal lines 61a-61d are formed so as to be a fan shape in an area near the driver IC 6, in order to expand respective spaces between the Tx signal lines 61a-61d.

Rx signal lines 62a-62d are pulled out from the TIA in a rightward direction, and are formed so as to be electrically connected to corresponding terminals of the edge connector 33. Here, the Rx signal lines 62a-62d are formed so as to be a fan shape in an area near the TIA 8, in order to expand respective spaces between the Rx signal lines 62a-62d.

In the flexible printed circuit 52, control lines for propagating control signals of the driver IC 6 are formed in an area 63. In an area 64, control lines for propagating control signals of the TIA 8 are formed.

In the optical module circuit board 51, in an area 65, signal lines that electrically connect the Tx signal lines 61a-61d to corresponding terminals of the edge connector 33 are formed. In an area 66, signal lines that electrically connect the Rx signal lines 62a-62d to corresponding terminals of the edge connector 33 are formed.

In the configuration illustrated in FIG. 5, it is difficult to reduce the height H of the optical module. The reason for this is described below.

In the flexible printed circuit 52, it is requested that the Tx signal lines 61a-61d and the Rx signal lines 62a-62d are formed so as not to be close to each other as described above. However, the driver IC 6 and the TIA 8 are disposed on the same side of the E/O converter 5 and the O/E converter 7. In addition, the Tx signal lines 61a-61d and the Rx signal lines 62a-62d are pulled out in the same direction with respect to the driver IC 6 and the TIA 8 (i.e., a direction extending to the right side in the optical module circuit board 51). As a result, when the Tx signal lines 61a-61d are formed so as to be a fan shape and the Rx signal lines 62a-62d are also formed so as to be a fan shape, the longitudinal length of the flexible circuit board 52 increases. Accordingly, when the flexible printed circuit 52 is attached to the optical module circuit board 51 so as to realize an optical module, the height H of the optical module inevitably increases.

On the other hand, in the optical module 1 according to the embodiment as illustrated in FIG. 4, the driver IC 6 and the TIA 8 are disposed on different sides from each other with respect to the E/O converter 5 and the O/E converter 7. In the example illustrated in FIG. 4, the driver IC 6 is disposed to the right of the E/O converter 5, and the TIA 8 is disposed to the left of the O/E converter 7. In addition, the Tx signal lines 11a-11d are pulled out in a rightward direction with respect to the driver IC 6, and the Rx signal lines 12a-12d are pulled out in a leftward direction with respect to the TIA 8. Namely, the Tx signal lines 11a-11d and the Rx signal lines 12a-12d are pulled out in substantially opposite directions to each other with respect to the E/O converter 5 and the O/E converter 7.

As described above, the Tx signal lines 11a-11d and the Rx signal lines 12a-12d are formed in different areas from each other in a lateral direction. Therefore, even when the Tx signal lines 11a-11d and the Rx signal lines 12a-12d are formed at the same longitudinal position, the Tx signal lines 11a-11d do not overlap with the Rx signal lines 12a-12d. Here, as illustrated in FIG. 4, the height of an area in which the Tx signal lines 11a-11d are formed in a fan shape is expressed as h(t), and the height of an area in which the Rx signal lines 12a-12d are formed in a fan shape is expressed as h(r). The height of an area in which the Tx signal lines 11a-11d and the Rx signal lines 12a-12d are formed (excluding an area in which the signal lines are extending in a longitudinal direction) is expressed as h(t+r). Then, h(t)+h(r)>h(t+r) is obtained. Therefore, even when the Tx signal lines 11a-11d are formed so as to be a fan shape and the Rx signal lines 12a-12d are also formed so as to be a fan shape, the longitudinal length of the flexible printed circuit 3 can be reduced. Accordingly, when the flexible printed circuit 3 is attached to the optical module circuit board 31 so as to realize the optical module 1, the height H of the optical module 1 can be smaller than the height in the configuration illustrated in FIG. 5.

In this example, the optical module 1 according to the embodiment is attached vertically to the blade main board 110 illustrated in FIG. 1C. Accordingly, when the height H of the optical module 1 is reduced, the width W of the blade 102 is also reduced.

Figure 6:
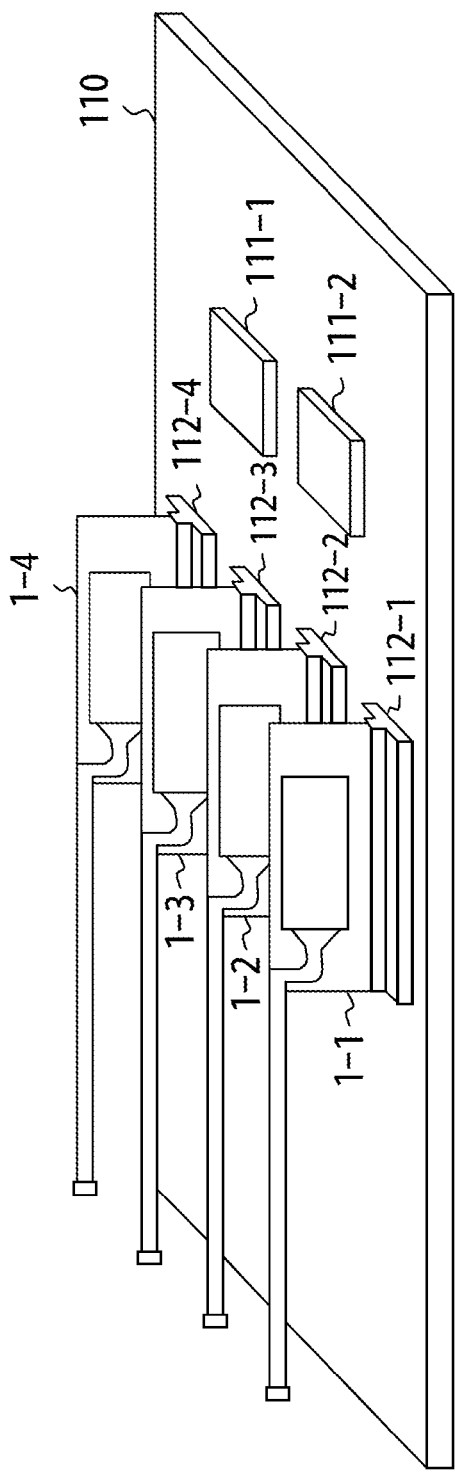
FIG. 6 illustrates an example in which an optical module is mounted on a blade main board.

FIG. 6 illustrates an example in which the optical module 1 is attached to the blade main board 110. In the example illustrated in FIG. 6, a plurality of optical modules 1 are attached to the blade main board 110.

In the example illustrated in FIG. 6, CPUs 111-1 and 111-2 and vertical connection type edge connector sockets 112-1 to 112-4 are mounted on the blade main board 110. Optical modules 1-1 to 1-4 are electrically connected to a circuit formed in the blade main board 110 via corresponding vertical connection type edge connector sockets 112-1 to 112-4. Each of the optical modules 1-1 to 1-4 corresponds to the optical module 1 according to the embodiment illustrated in FIG. 4.

In the above configuration, the CPUs 111-1 and 111-2 can transmit data to other blades via the optical modules 1-1 to 1-4. In addition, the CPUs 111-1 and 111-2 can receive data from other blades via the optical modules 1-1 to 1-4.

In the optical module according to the embodiment, a crosstalk between a Tx data signal and an Rx data signal is reduced. Namely, in the configuration illustrated in FIG. 5, the Tx signal lines 61a-61d and the Rx signal lines 62a-62d are formed in substantially the same direction. As a result, the crosstalk between the Tx data signal and the Rx data signal is likely to increase. On the other hand, in the optical module 1 according to the embodiment, the Tx signal lines 11a-11d and the Rx signal lines 12a-12d are formed substantially in the opposite directions to each other. As a result, the crosstalk between the Tx data signal and the Rx data signal is suppressed.

FIGS. 7A and 7B illustrate a simulation result regarding a crosstalk between a transmission signal and a received signal. Here, two models illustrated in FIG. 7A are compared. Model A corresponds to the optical module 1 according to the embodiment, and the Tx signal lines and the Rx signal lines are formed in the opposite directions to each other. In Model B, the Tx signal lines and the Rx signal lines are formed in the same direction as each other. Assuming the worst condition, in Model A and Model B, the spacing between the Tx signal lines and the Rx signal lines are the same as the pitch or spacing of the optical device. Namely, the spacing between the Tx signal lines and the Rx signal lines are 250 μm. In the above models, a crosstalk from Port P1 to Port P4 is simulated.

According to the above simulation, compared with Model B, Model A can obtain an improvement of 20 dB or more. Namely, in the optical module 1 according to the embodiment, the crosstalk between the transmission signal and the received signal is suppressed.

In the configuration illustrated in FIG. 5, one reason why the longitudinal length of the flexible printed circuit 52 increases is that the Tx signal lines 61a-61d and the Rx signal lines 62a-62d are formed on one surface of the flexible printed circuit 52. Therefore, when a multilayer circuit board is adopted instead of the flexible printed circuit 52 and the Tx signal lines 61a-61d and the Rx signal lines 62a-62d are formed in the same area in different layers so that a portion of the Tx signal lines 61a-61d overlaps a portion of the Rx signal lines 62a-62d, the size of the circuit board can be reduced. However, the thickness of the multilayer circuit board is greater than that of the flexible printed circuit. When the circuit board becomes thicker, the optical loss between the E/O converter 5 and the core 4a of the optical waveguide 4 and the optical loss between the core 4a and the O/E converter 7 increase. In order to reduce the optical loss, a configuration in which a flexible printed circuit is adopted as a circuit board for mounting the E/O converter 5, the driver IC 6, the O/E converter 7, and the TIA 8 is preferable.

In the configuration according to the embodiment, even when a flexible printed circuit with a small optical loss is adopted, the height of an optical module can be reduced. Namely, in the configuration according to the embodiment, the height of the optical module can be reduced while forming the Tx signal lines 11a-11d and the Rx signal lines 12a-12d on one surface of a circuit board.

Note that the present invention does not exclude a configuration in which the E/O converter 5, the driver IC 6, the O/E converter 7, and the TIA 8 are mounted on a circuit board other than the flexible printed circuit.

Further, in the above example, the driver IC 6 is disposed to the right of the E/O converter 5 and the TIA 8 is disposed to the left of the O/E converter 7. However, the present invention is not limited to this configuration. Namely, the driver IC 6 may be disposed to the left of the E/O converter 5 and the TIA 8 may be disposed to the right of the O/E converter 7.

Furthermore, as an example, the optical module 1 is used for transmitting and receiving data between blades of the blade server 100. However, the present invention is not limited to this. Namely, the optical module 1 according to the embodiment may be used for transmitting and receiving an optical signal between desired apparatuses.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present inventions have been described in detail, it should be understood that the various changes, substitutions, and alterations could be made hereto without departing from the spirit and scope of the invention.

What is claimed is:

1. An optical module comprising:
a first circuit board in which a first edge connector is formed and a connector socket is mounted substantially in parallel to the first edge connector; and
an optical transceiver module that is electrically connected to the first circuit board via the connector socket, wherein
the optical transceiver module includes:
a second circuit board on which an electrical-to-optical converter, a drive circuit that drives the electrical-to-optical converter, an optical-to-electrical converter, and a current-to-voltage conversion circuit that converts an output current of the optical-to-electrical converter into a voltage signal are mounted; and
an optical waveguide that guides an optical signal generated by the electrical-to-optical converter to an output end of the optical transceiver module, and that guides an optical signal input to the optical transceiver module to the optical-to-electrical converter, and wherein
the second circuit board has a second edge connector corresponding to the connector socket mounted on the first circuit board,
the electrical-to-optical converter, the drive circuit, the optical-to-electrical converter, and the current-to-voltage conversion circuit are disposed in the center area of the second circuit board,
signal lines of the drive circuit are pulled out from the drive circuit in a first direction, and are formed to reach corresponding terminals of the second edge connector, and
signal lines of the current-to-voltage conversion circuit are pulled out from the current-to-voltage conversion circuit in a second direction that is substantially opposite to the first direction, and are formed so as to reach corresponding terminals of the second edge connector.

2. The optical module according to claim 1, wherein
the second edge connector is formed on a side extending in a lateral direction of the second circuit board, and
the first and second directions are substantially lateral directions of the second circuit board.

3. The optical module according to claim 2, wherein the electrical-to-optical converter and the optical-to-electrical converter are aligned in a longitudinal direction of the second circuit board.

4. The optical module according to claim 3, wherein
the drive circuit is disposed to the right of the electrical-to-optical converter, and
the current-to-voltage conversion circuit is disposed to the left of the optical-to-electrical converter.

5. The optical module according to claim 3, wherein
the drive circuit is disposed to the left of the electrical-to-optical converter, and
the current-to-voltage conversion circuit is disposed to the right of the optical-to-electrical converter.

6. The optical module according to claim 2, wherein the optical waveguide is fixed to the second circuit board so as to propagate optical signals in a lateral direction of the second circuit board.

7. The optical module according to claim 1, wherein
the optical waveguide includes a transmitting optical waveguide channel that guides the optical signal generated by the electrical-to-optical converter to an output end of the optical transceiver module, and a receiving optical waveguide channel that guides the optical signal input to the optical transceiver module to the optical-to-electrical converter, and
the transmitting optical waveguide channel and the receiving optical waveguide channel are formed in parallel to each other so as to extend in the same direction from the vicinity of the electrical-to-optical converter and the optical-to-electrical converter.

8. The optical module according to claim 1, wherein a direction in which a transmission signal is directed through the drive circuit to the electrical-to-optical converter is approximately the same as a direction in which a received signal is directed through the current-to-voltage conversion circuit to a signal line of the current-to-voltage conversion circuit.

9. The optical module according to claim 1, wherein
the electrical-to-optical converter, the drive circuit, the optical-to-electrical converter, and the current-to-voltage converter are face-down connected to one surface of the second circuit board, and
the optical waveguide is attached to the other surface of the second circuit board.

10. The optical module according to claim 1, wherein the first edge connector formed in the first circuit board corresponds to vertical connection type edge connector socket.

11. The optical module according to claim 1, wherein the second circuit board is a flexible printed circuit.

* * * * *